US011591499B2

(12) United States Patent
Sato et al.

(10) Patent No.: US 11,591,499 B2
(45) Date of Patent: Feb. 28, 2023

(54) ANISOTROPIC CONDUCTIVE FILM (71) Applicant: DEXERIALS CORPORATION, Tokyo (JP)

(72) Inventors: Daisuke Sato, Utsunomiya (JP); Yasushi Akutsu, Utsunomiya (JP); Ryousuke Odaka, Tokyo (JP); Yusuke Tanaka, Saitama (JP)

(73) Assignee: DEXERIALS CORPORATION, Shimotsuke (JP)

( * ) Notice: Subject to any disclaimer, the term of this patent is extended or adjusted under 35 U.S.C. 154(b) by 0 days.

(21) Appl. No.: 15/541,881

(22) PCT Filed: Jan. 13, 2016

(86) PCT No.: PCT/JP2016/050858
§ 371 (c)(1),
(2) Date: Jul. 6, 2017

(87) PCT Pub. No.: WO2016/114314
PCT Pub. Date: Jul. 21, 2016

(65) Prior Publication Data
US 2018/0002575 A1 Jan. 4, 2018

(30) Foreign Application Priority Data
Jan. 13, 2015 (JP) .............................. JP2015-004597

(51) Int. Cl.
| C09J 9/02 | (2006.01) |
| C09J 7/10 | (2018.01) |
| H05K 3/32 | (2006.01) |
| H01B 1/22 | (2006.01) |
| C09J 11/04 | (2006.01) |
| C09J 163/00 | (2006.01) |
| H01L 27/146 | (2006.01) |
| H01R 4/04 | (2006.01) |
| H04N 5/225 | (2006.01) |
| H05K 1/18 | (2006.01) |
| C08K 3/08 | (2006.01) |
| G03B 17/02 | (2021.01) |
| H05K 1/03 | (2006.01) |
| C08K 3/10 | (2018.01) |
| C08K 3/36 | (2006.01) |
| C08K 9/02 | (2006.01) |
| H05K 1/02 | (2006.01) |

(52) U.S. Cl.
CPC . *C09J 9/02* (2013.01); *C09J 7/10* (2018.01); *C09J 11/04* (2013.01); *C09J 163/00* (2013.01); *H01B 1/22* (2013.01); *H01L 27/14618* (2013.01); *H01R 4/04* (2013.01); *H04N 5/2253* (2013.01); *H05K 1/181* (2013.01); *H05K 3/323* (2013.01); *C08K 3/08* (2013.01); *C08K 3/10* (2013.01); *C08K 3/36* (2013.01); *C08K 9/02* (2013.01); *C08K 2201/001* (2013.01); *C08K 2201/003* (2013.01); *C09J 2203/326* (2013.01); *C09J 2301/408* (2020.08); *G03B 17/02* (2013.01); *H01L 2224/48091* (2013.01); *H05K 1/0269* (2013.01); *H05K 1/0306* (2013.01); *H05K 2201/09918* (2013.01); *H05K 2201/10121* (2013.01); *H05K 2201/10151* (2013.01)

(58) Field of Classification Search
CPC ........................................................ C09J 9/02
See application file for complete search history.

(56) References Cited

U.S. PATENT DOCUMENTS

| 4,731,282 A * | 3/1988 | Tsukagoshi | ....... H01L 23/49883 257/E23.075 |
| 10,522,502 B2 * | 12/2019 | Shinohara | .................. C09J 9/02 |
| 2001/0046021 A1 * | 11/2001 | Kozuka | .................. H05K 3/323 349/150 |
| 2003/0102466 A1 * | 6/2003 | Kumakura | ................. C09J 7/10 252/511 |
| 2004/0091748 A1 * | 5/2004 | Kamata | ................. G11B 5/855 428/848.5 |
| 2006/0280912 A1 * | 12/2006 | Liang | ...................... H01B 1/24 428/173 |
| 2011/0194023 A1 | 8/2011 | Tam et al. | |
| 2012/0112370 A1 | 5/2012 | Kobayashi | |
| 2014/0022449 A1 | 1/2014 | Nagasawa | |

(Continued)

FOREIGN PATENT DOCUMENTS

| CN | 103177795 A | 6/2013 |
| JP | S62-229714 A | 10/1987 |

(Continued)

OTHER PUBLICATIONS

Mar. 20, 2018 Office Action issued in Japanese Patent Application No. 2016-004456.

(Continued)

Primary Examiner — Irina Krylova
(74) Attorney, Agent, or Firm — Oliff PLC (57) ABSTRACT

An anisotropic conductive film, capable of connecting a terminal formed on a substrate having a wavy surface such as a ceramic module substrate with conduction characteristics stably maintained, includes an insulating adhesive layer, and conductive particles regularly arranged in the insulating adhesive layer as viewed in a plan view. The conductive particle diameter is 10 μm or more, and the thickness of the film is 1 or more times and 3.5 or less times the conductive particle diameter. The variation range of the conductive particles in the film thickness direction is less than 10% of the conductive particle diameter.

20 Claims, 7 Drawing Sheets (56) References Cited

U.S. PATENT DOCUMENTS

| | | | | |
|---|---|---|---|---|
| 2014/0313402 | A1* | 10/2014 | Kim | H04N 5/2253 348/373 |
| 2015/0214176 | A1* | 7/2015 | Shinohara | C08G 59/68 361/767 |
| 2015/0231803 | A1 | 8/2015 | Shinohara et al. | |
| 2015/0237725 | A1 | 8/2015 | Yamada et al. | |

FOREIGN PATENT DOCUMENTS

| | | | |
|---|---|---|---|
| JP | S63-102110 | A | 5/1988 |
| JP | S64-14886 | A | 1/1989 |
| JP | 2001-307555 | A | 11/2001 |
| JP | 2004-035686 | A | 2/2004 |
| JP | 2004035686 | * | 2/2004 |
| JP | 2005-200521 | A | 7/2005 |
| JP | 4887700 | B2 | 2/2012 |
| JP | 2012-099729 | A | 5/2012 |
| JP | 2013-516656 | A | 5/2013 |
| JP | 2013-110226 | A | 6/2013 |
| JP | 2014-022248 | A | 2/2014 |
| JP | 2014-044948 | A | 3/2014 |
| JP | 2014-060025 | A | 4/2014 |
| JP | 2014-102943 | A | 6/2014 |
| JP | 2014-159575 | A | 9/2014 |
| TW | 201700664 | A | 1/2017 |
| WO | 2006/075381 | A1 | 7/2006 |
| WO | 2012/098929 | A1 | 7/2012 |
| WO | 2014/030744 | A1 | 2/2014 |
| WO | 2014/030753 | A1 | 2/2014 |

OTHER PUBLICATIONS

May 1, 2018 Office Action issued in Japanese Application No. 2016-004456.
May 8, 2017 International Preliminary Report on Patentability issued in International Application No. PCT/JP2016/050858.
Oct. 30, 2018 Office Action issued in Japanese Patent Application No. 2018-135951.
Jul. 4, 2018 Office Action issued in Chinese Patent Application No. 201680004711.3.
Jun. 19, 2018 Office Action issued in Japanese Patent Application No. 2016-004456.
Mar. 15, 2016 International Search Report issued in International Patent Application No. PCT/JP2016/050858.
Feb. 14, 2017 International Preliminary Report on Patentability issued in International Patent Application No. PCT/JP2016/050858.
Mar. 15, 2016 Written Opinion issued in International Patent Application No. PCT/JP2016/050858.
Sep. 6, 2019 Office Action issued in Filipino Patent Application No. 1-2017-501262.
Sep. 10, 2019 Office Action issued in Taiwanese Patent Application No. 105101043.
Jun. 4, 2020 Office Action issued in Philippines Patent Application No. 1/2017/501262.
Apr. 7, 2020 Office Action issued in Chinese Patent Application No. 201910329405.2.
Nov. 2, 2021 Office Action issued in Chinese Patent Application No. 201910329405.2.
Nov. 5, 2020 Office Action issued in Chinese Patent Application No. 201910329405.2.
May 21, 2021 Office Action issued in Chinese Patent Application No. 20190329405.2.
Jan. 10, 2022 Office Action issued in Taiwanese Patent Application No. 109113326.

* cited by examiner

FIG. 1A

FIG. 1B (Cross-Sectional View Along x-x)

FIG. 10B (Cross-Sectional View Along x-x)

ANISOTROPIC CONDUCTIVE FILM

TECHNICAL FIELD

The present invention relates to an anisotropic conductive film.

BACKGROUND ART

An anisotropic conductive film has been widely used in mounting an electronic part such as an IC chip on a substrate. In recent years, high densification of wirings in a compact electronic device such as a mobile phone and a notebook computer has been required. As a technique of applying the high densification to the anisotropic conductive film, a technique of uniformly disposing conductive particles in an insulating adhesive layer of the anisotropic conductive film in a lattice shape, and in particular, a technique in which conductive particles having a particle diameter of 5 μm or less are used and the arrangement of the conductive particles is inclined at a predetermined angle relative to the longitudinal direction of the anisotropic conductive film have been proposed (Patent Literature 1).

In a camera module and a compact camera module in which an image sensor such as a CMOS and a lens are mounted on a module substrate, a ceramic module substrate is often used from the viewpoint of excellent electrically and thermally insulating properties (Patent Literature 2).

CITATION LIST

Patent Literature

Patent Literature 1: Japanese Patent No. 4887700
Patent Literature 2: Japanese Translation of PCT Patent Application Publication No. 2013-516656

SUMMARY OF INVENTION

Technical Problem

However, a surface of the ceramic module substrate is wavy. When a terminal on the ceramic substrate is obtained by sintering a terminal pattern formed by printing, or the like, the height of the terminal itself may be uneven. When the substrate having such a wavy surface is mounted on a wiring substrate using an anisotropic conductive film, particle capturing properties of a terminal at a convex portion and a terminal at a concave portion of waviness are different. Therefore, a problem such as uneven conduction characteristics occurs. When a resin forming an insulating adhesive layer is molten and flows during anisotropic conductive connection, conductive particles on the terminal at the convex portion of the waviness are carried, and are hardly captured by the terminal. As one example, the height of the waviness is 20 to 50 μm and the wavelength thereof is several hundreds μm or more although the wavy surface depends on a method of manufacturing a ceramic substrate.

The problem of the waviness is not limited to the ceramic substrate. For example, the height of electrode surface of an FR4 substrate (glass epoxy substrate) or the like is varied depending on a substrate. As one example, the maximum difference of height variation of electrode surface is 2 to 3 μm.

On the other hand, in order to improve conduction characteristics, it is conceivable that the heating and pressurization conditions during anisotropic conductive connection are changed to higher temperature and higher pressure. However, since an image sensor or a lens is mounted on a module substrate, it is necessary that anisotropic conductive connection be usually performed under a low-temperature and low-pressure condition of a temperature of 190° C. or lower and a pressure of 2 MPa or lower.

An object of the present invention is to provide an anisotropic conductive film capable of connecting a terminal formed on a substrate having a wavy surface such as a ceramic module substrate or a terminal in which the height of an electrode surface itself is uneven, with conduction characteristics stably maintained.

Solution to Problem

The present inventors have found that the aforementioned problems can be solved when the size of conductive particles regularly arranged in an insulating adhesive layer is made larger than the conductive particle diameter of an anisotropic conductive film used in a terminal of fine pitch such as a chip on glass (COG), the relationship between the thickness and the conductive particle diameter of the anisotropic conductive film is specifically defined, and the position of the conductive particles in the film thickness direction is specifically defined. The present invention has thus been completed.

Specifically, the present invention provides an anisotropic conductive film including an insulating adhesive layer and conductive particles regularly arranged in the insulating adhesive layer as viewed in a plan view, wherein the conductive particle has a conductive particle diameter of 10 μm or more, the film has a thickness of 1 or more times and 3.5 or less times the conductive particle diameter, and positions of the conductive particles are varied in a thickness direction of the film within a variation range of less than 10% of the conductive particle diameter.

The present invention provides a connection structure wherein a first electronic component and a second electronic component are anisotropically, conductively connected by the anisotropic conductive film.

Advantageous Effects of Invention

According to the anisotropic conductive film of the present invention, not only a terminal formed on a substrate having a flat surface but also a terminal formed on a substrate having a wavy surface such as a ceramic module substrate or a terminal in which the height of an electrode surface itself is uneven can be anisotropically, conductively connected while conduction resistance is stably maintained. Therefore, according to the connection structure of the present invention, each connecting terminal exerts good conduction characteristics even in connection to a camera module using a ceramic substrate.

DESCRIPTION OF EMBODIMENTS

Hereinafter, the present invention will be described in detail with reference to the drawings. In the drawings, the same reference numerals denote the same or similar components.

Figure 1A:
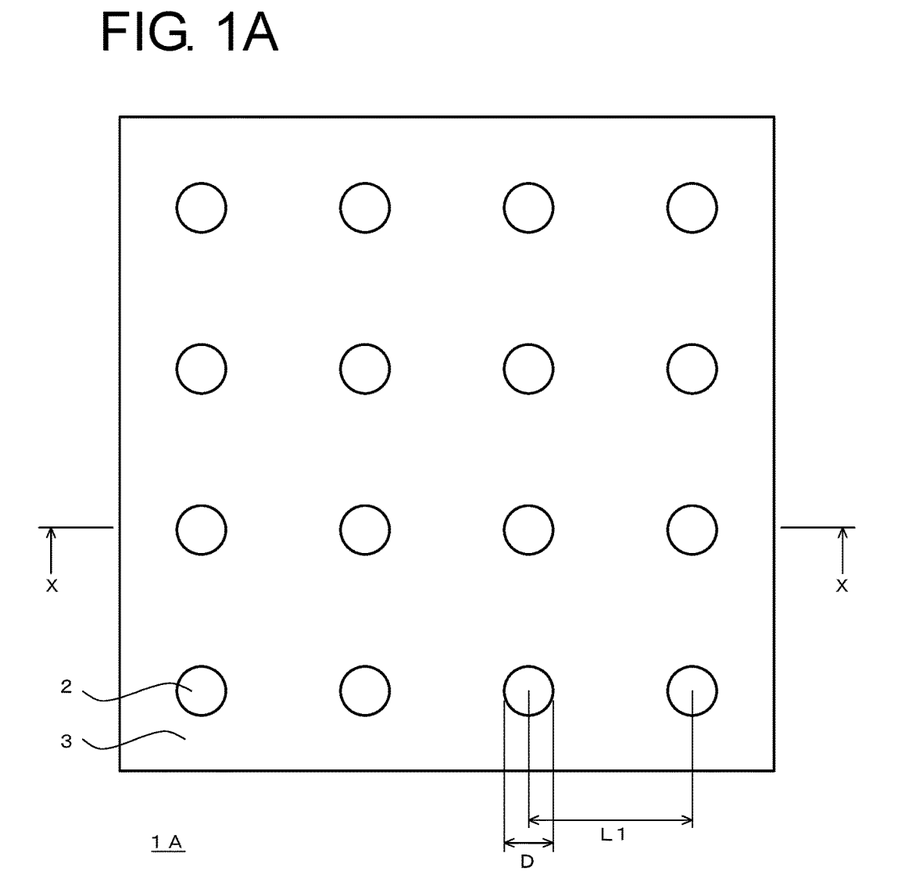
FIG. 1A is a plan view of an anisotropic conductive film 1A of an example.
Figure 1B:
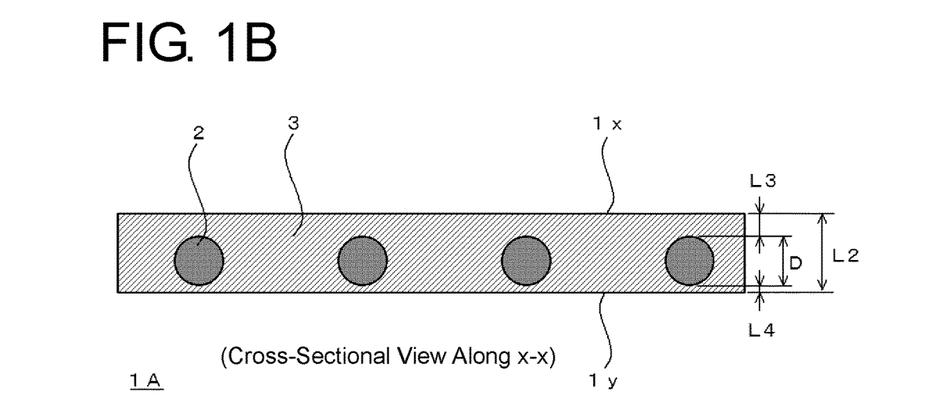
FIG. 1B is a cross-sectional view of the anisotropic conductive film 1A of the example.

FIG. 1A is a plan view of an anisotropic conductive film 1A of one embodiment of the present invention, and FIG. 1B is a cross-sectional view thereof. The anisotropic conductive film 1A is generally a film in which conductive particles 2 having a predetermined particle diameter are regularly arranged in a lattice shape in an insulating adhesive layer 3 and which has a predetermined film thickness.

<Conductive Particle Diameter>

In the present invention, the particle diameter of the conductive particles 2 (i.e., conductive particle diameter D) is 10 μm or more, preferably 15 μm or more, and more preferably 20 μm or more in order to achieve stable conduction even when the surface of a substrate to be connected is flat or wavy like a ceramic module substrate. From the viewpoint of availability, the particle diameter of the conductive particles 2 is preferably 50 μm or less, and more preferably 30 μm or less.

In the present invention, the conductive particle diameter D means the average particle diameter of the conductive particles 2.

<Particle Arrangement>

In the present invention, the conductive particles 2 are regularly arranged in the insulating adhesive layer 3 as viewed in a plan view. In the anisotropic conductive film 1A of the example, the conductive particles 2 are arranged in a square lattice shape as viewed in a plan view. In the present invention, the regular arrangement of the conductive particles 2 may be an arrangement in which the conductive particles are regularly arranged so that the density in the plane arrangement of the conductive particles is even. For example, when a particle density of conductive particles is measured at each of ten regions which each have an area of 1 mm×1 mm and are extracted in the film longitudinal direction, a difference between the maximum and minimum values of the measured particle densities is set to be less than 20% of the average of the particle densities at the respective regions. In this case, the conductive particles may be arranged in a lattice shape such as an orthorhombic lattice shape, a rectangular lattice shape, or a hexagonal lattice shape. When the conductive particles are regularly arranged as described above, the conductive particles are easily captured even by a terminal which is formed on a wavy connection surface. Therefore, occurrence of conduction failure and short circuit can be significantly decreased. Even when an alignment mark is shifted due to waviness of surface of a substrate in positioning an electronic component using the alignment mark for connection, the conductive particles can be captured by a terminal and conduction can be reliably achieved.

On the other hand, when the conductive particles 2 are randomly dispersed and a part where the particle density of the conductive particles is low is disposed on a terminal at a convex portion of waviness of a module substrate during anisotropic conductive connection, the conductive particles on the terminal are carried, and the particle density at that part is further decreased. As a result, the number of conductive particles captured at the terminal is decreased, and conduction failure is easy to occur.

Figure 2:
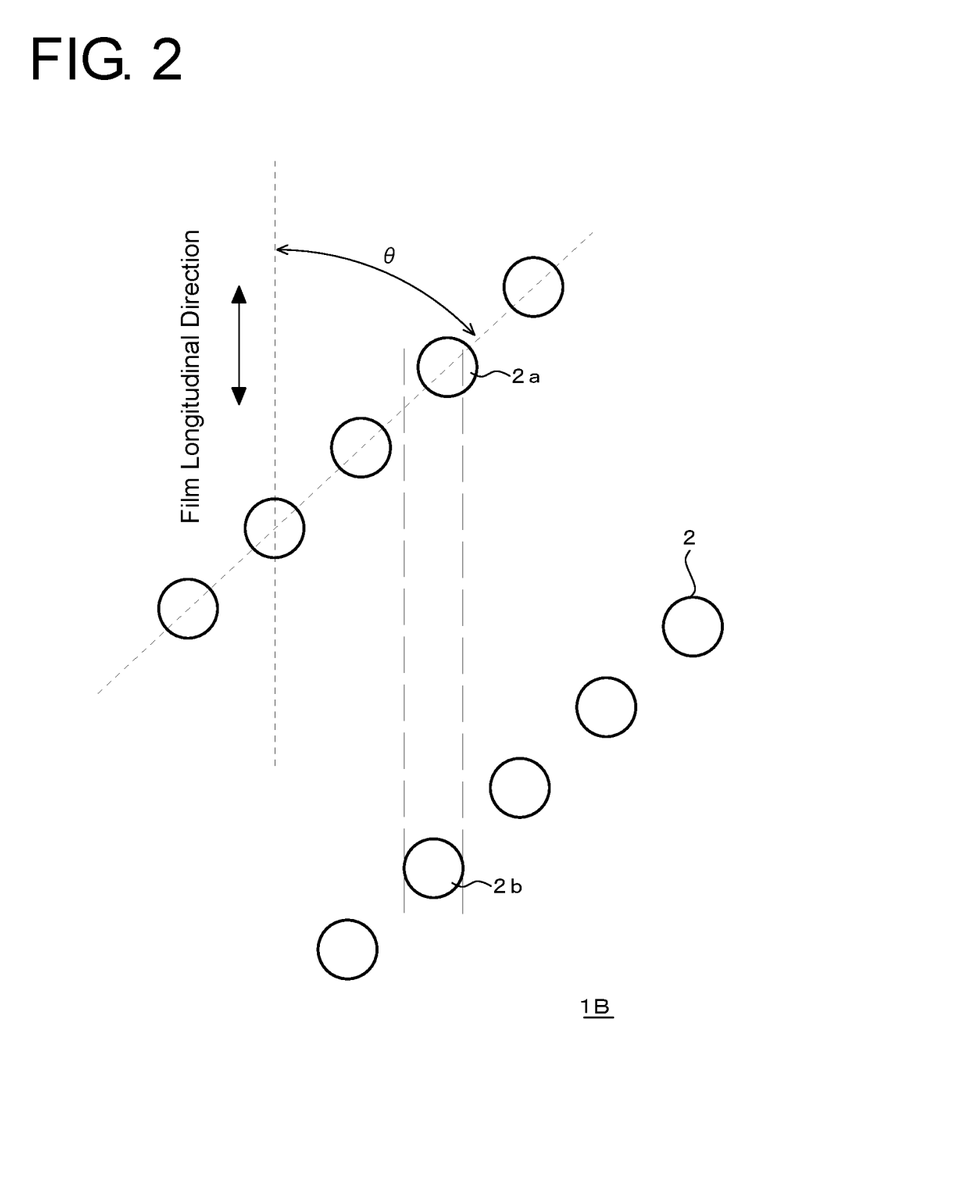
FIG. 2 is a plan view of an anisotropic conductive film 1B of an example.

When the conductive particles 2 are arranged in a lattice shape, it is preferable that the axis of the lattice be inclined relative to the longitudinal direction of the anisotropic conductive film in terms of stabilizing the particle capturing properties of a terminal. For example, in an anisotropic conductive film 1B in which conductive particles are arranged in a rectangular lattice shape as shown in FIG. 2, an angle θ formed between the axis of the lattice and the film longitudinal direction is preferably 10 to 40°. In order to improve the particle capturing properties of a terminal, it is preferable that the conductive particles 2 be arranged so that conductive particles 2a and 2b present on adjacent axes of the lattice overlap each other in the film longitudinal direction.

For the regular arrangement of the conductive particles 2, when the distance between centers of adjacent conductive particles is too short, short circuit is easy to occur. When the distance is too long, the number of conductive particles to be captured is insufficient, and sufficient conductive connection cannot be achieved. Therefore, in terms of prevention of short circuit and stability of conductive connection, the distance between centers of the most closely adjacent conductive particles (in this embodiment, the arrangement pitch L1 of the square lattice) is set to be preferably 1.2 to 100 times, and more preferably 1.5 to 80 times the conductive particle diameter D.

On the other hand, the thickness L2 of the anisotropic conductive film 1A is 1 or more times and 3.5 or less times the conductive particle diameter D, preferably 3.0 or less times, more preferably 2.5 or less times, and further preferably 1.1 or more times and 2.3 or less times the conductive particle diameter D. When the thickness L2 of the anisotropic conductive film 1A is too large, a resin forming the insulating adhesive layer 3 may be protruded from a part of anisotropic conductive connection, or the conduction stability of a terminal may be decreased. Also in this case, when the anisotropic conductive film is formed in an elongated shape and is wound up around a reel for storage, there is a problem in which the insulating adhesive layer is protruded from the wound anisotropic conductive film. In contrast, when the thickness L2 of the anisotropic conductive film 1A is too small, formation surfaces of terminals to be anisotropically, conductively connected cannot be sufficiently bonded. In particular, when the terminal formation surface is wavy, reliable bonding of a concave portion of the waviness is difficult. When the thickness L2 of the anisotropic conductive film 1A is set to be 1 or more times and 3.5 or less times the conductive particle diameter D, preferably 3.0 or less times, and further preferably 2.5 or less times the conductive particle diameter D, there is no problem such as protrusion of the resin, decrease in conduction stability, and bonding failure of the terminal formation surface. When the thickness L2 of the anisotropic conductive film 1A is close to the conductive particle diameter D, resin flow during anisotropic conductive connection is relatively decreased. Therefore, in connecting not only a wavy substrate but also a substrate which is not wavy (for example, glass substrate) using the anisotropic conductive film of the present invention, the conductive particle capturing properties of the terminal is also improved.

In the arrangement of the conductive particles 2 in the thickness direction of the anisotropic conductive film 1A, the variation range of position of the conductive particles in the film thickness direction is less than 10% of the conductive particle diameter D. When the conductive particles 2 are clearly eccentrically present so as to be close to one surface of front and back surfaces of the anisotropic conductive film 1A, the variation range is measured as a variation range of a distance L4 between a surface 1y on a side close to the conductive particles and each of the conductive particles 2. Otherwise, the variation range is measured as a variation range of a distance between either one surface and each of the conductive particles. More specifically, the variation range is obtained as a difference ΔL4 between the maximum and minimum values obtained by extracting 100 conductive particles 2 consecutively in the film longitudinal direction, and measuring distances L4 about each of the conductive particles 2. The ratio of the variation range ΔL4 to the conductive particle diameter is a ratio of the variation range ΔL4 to the average conductive particle diameter D. When the variation range ΔL4 is less than 10% of the conductive particle diameter D, the variation range ΔL4 is usually 5 μm or less, preferably 3 μm or less, and more preferably 2 μm or less.

When the positions of the conductive particles 2 in the film thickness direction are aligned, as described above, the pressing force applied to each terminal is even during anisotropic conductive connection using the anisotropic conductive film 1A. Therefore, uneven conductive particle 2 capturing properties of the terminals can be reduced. The pressing force applied to each terminal which is even during anisotropic conductive connection can be confirmed from a state where indentations formed on each terminal by the conductive particles 2 through anisotropic conductive connection are aligned.

Among the front and back surfaces of the anisotropic conductive film 1A, the distance L3 between a surface 1x thereof on a side apart from the conductive particles 2 and each conductive particle 2 is preferably 10% or more of the conductive particle diameter D.

It is preferable that the surface 1y on the side close to the conductive particles among the front and back surfaces of the anisotropic conductive film 1A be allowed to face an electronic component which is to be first attached to the anisotropic conductive film among two electronic components for anisotropic conductive connection, and anisotropic conductive connection be performed. For example, when a flexible printed substrate having a connection surface which is not wavy and a wavy ceramic substrate are anisotropically, conductively connected, the surface 1y of the anisotropic conductive film is allowed to face the wavy ceramic substrate. Thus, stability of pushing can be improved, and bending of the substrate can be absorbed by the insulating adhesive layer 3 over the whole film. Therefore, the conduction characteristics can be largely improved. Even when the surface 1x on the side apart from the conductive particles 2 faces the wavy substrate and is connected to the wavy substrate, variation in conduction characteristics at a terminal of the wavy substrate can be reduced. In the present invention, the variation range of the distance L4 described above is less than 10% of the conductive particle diameter D. However, the variation range of the distance L3 may not be less than 10% of the conductive particle diameter.

Figure 3:
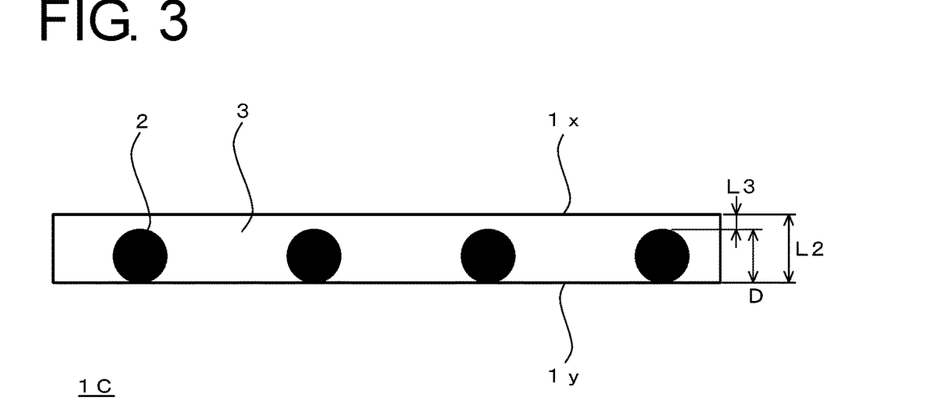
FIG. 3 is a cross-sectional view of an anisotropic conductive film 1C of an example.

In order to set the distance L3 between one surface 1x of the anisotropic conductive film and each conductive particle 2 to be 10% or more of the conductive particle diameter D, the conductive particles 2 may be disposed into contact with the other surface 1y of an anisotropic conductive film 1C as shown in FIG. 3, or close to the other surface 1y. Also in this case, it is preferable that the surface 1y is allowed to face an electronic component which is to be first attached to the anisotropic conductive film during anisotropic conductive connection, and anisotropic conductive connection be performed.

Regardless of the thickness of the anisotropic conductive film 1A, it is preferable that the conductive particles 2 be each close to one surface 1y of the anisotropic conductive film 1A, as shown in FIG. 1B. More specifically, the distance L4 between the surface 1y of the anisotropic conductive film 1A and each conductive particle 2 is preferably less than 1 time the conductive particle diameter D, and more preferably 30% or less of the particle diameter. The conductive particles 2 may be arranged to be flush with the surface 1y of the anisotropic conductive film 1A. In particular, when the thickness of the film is set to be more than 2.5 times the particle diameter, resin flow during pushing is relatively increased. Therefore, it is preferable that the conductive particles be provided close to the terminal from the viewpoint of capturing properties.

<Particle Density of Conductive Particles>

The particle density of the conductive particles 2 is preferably 20 to 2,000 particles/mm$^2$, more preferably 40 to 1,500 particles/mm$^2$, and further preferably 150 to 850 particles/mm$^2$ from the viewpoint of conduction reliability.

<Constituent Material for Conductive Particles>

The configuration of the conductive particles 2 themselves can be appropriately selected from conductive particles used in a publicly known anisotropic conductive film, and used. Examples of the conductive particles may include particles of metals such as nickel, cobalt, silver, copper, gold, and palladium, and metal-coated resin particles in which core resin particles are coated with a metal. Two or more types thereof may be used in combination. Herein, the metal coating of the metal-coated resin particles can be formed using a known metal film forming method such as an electroless plating method or a sputtering method. The core resin particles may be formed from only a resin. In order to improve conduction reliability, the core resin particles may be core resin particles in which fine conductive particles are dispersed.

<Insulating Adhesive Layer>

As the insulating adhesive layer 3, an insulating resin layer used in a publicly known anisotropic conductive film can be appropriately adopted. For example, a photoradically polymerizable resin layer containing an acrylate compound and a photoradical polymerization initiator, a thermo-radically polymerizable resin layer containing an acrylate compound and a thermo-radical polymerization initiator, a thermo-cationically polymerizable resin layer containing an epoxy compound and a thermo-cationic polymerization initiator, a thermo-anionically polymerizable resin layer containing an epoxy compound and a thermo-anionic polymerization initiator, or the like, can be used. The resin layers may be those obtained by polymerization, if necessary. Further, the insulating adhesive layer 3 may be formed from a single resin layer or a plurality of resin layers.

To the insulating adhesive layer 3, an insulating filler such as silica fine particles, alumina, or aluminum hydroxide, may be added, if necessary. The amount of the insulating filler to be added is preferably 3 to 40 parts by mass relative to 100 parts by mass of the resin forming the insulating adhesive layer. In this case, even when the insulating adhesive layer 3 is molten during anisotropic conductive connection, unnecessary movement of the conductive particles 2 by the molten resin can be suppressed.

It is preferable that tackiness of the insulating adhesive layer 3 be high. This is because the attachment to the wavy substrate is improved. In particular, when the distance L3 between each conductive particle 2 and one surface 1x of the film cannot be set to be 10% or more of the conductive particle diameter D, enhancement in tackiness of the insulating adhesive layer 3 is strongly required.

The lowest melt viscosity of the insulating adhesive layer 3 (when the anisotropic conductive film is formed from a number of resin layers, the lowest melt viscosity of the whole resin layer) is preferably 100 to 30,000 Pa·s, more preferably 500 to 20,000 Pa·s, and particularly preferably 1,000 to 10,000 Pa·s. This is because the conductive particles can be precisely arranged and trouble in capturing properties for the conductive particles which is caused by resin flow due to pushing during anisotropic conductive connection can be prevented. The lowest melt viscosity is measured using a rotational rheometer (TA Instruments) under conditions of a temperature increasing rate of 10° C./min, a constant measurement pressure of 5 g, and a measurement plate diameter of 8 mm.

<Method for Manufacturing Anisotropic Conductive Film>

As a method for manufacturing the anisotropic conductive film 1A so that the conductive particles 2 are regularly arranged as viewed in a plan view and the variation range in the film thickness direction is less than 10% of the conductive particle diameter D, a die having a convex portion so as to correspond to the arrangement of the conductive particles 2 is produced by processing a flat metal plate by a known processing method such as machining, laser processing, or photolithography. The die is filled with a curable resin, and the curable resin is cured, to prepare a resin mold with inverted concave and convex portions. The resin mold is used as a microcavity for conductive particles, and the concave portions of the resin mold are charged with the conductive particles, and filled with a composition for forming an insulating adhesive layer over the conductive particles. The composition is cured, and taken out from the mold. On the resin layer taken out from the mold, a resin layer forming an insulating adhesive layer may be further laminated, if necessary. When a step of filling the mold with the conductive particles, a step of filling the mold with the insulating adhesive layer, and a step of separating are separately performed, as described above, the conductive particles can be held at the bottom of the mold. Therefore, the variation range of the conductive particles in the film thickness direction can be suppressed.

As a method of aligning the positions of the conductive particles 2 in the film thickness direction in the vicinity of the surface 1y of the anisotropic conductive film 1A or so as to bring the conductive particles 2 into contact with the surface 1y, it is preferable that the aforementioned mold be filled with the conductive particles, and filled with the composition for forming an insulating adhesive layer over the conductive particles, the composition be cured and taken out from the mold, and then the conductive particles be pushed in the insulating adhesive layer to form the insulating adhesive layer of a single layer.

Modified Embodiment

The anisotropic conductive film of the present invention can have various embodiments.

Figure 4:
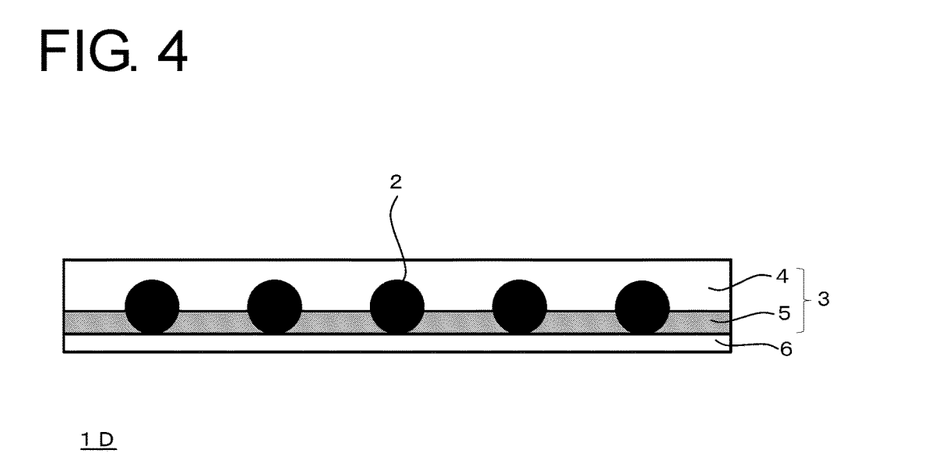
FIG. 4 is a cross-sectional view of an anisotropic conductive film 1D of an example.

For example, when the insulating adhesive layer 3 is formed from a plurality of resin layers, the insulating adhesive layer 3 is formed from an adhesive layer 4 and a UV cured layer 5, and each conductive particle 2 is disposed into contact with the surface of the UV cured layer 5, like an anisotropic conductive film 1D shown in FIG. 4. On the UV cured layer 5, a tack layer 6 is provided.

Herein, the adhesive layer 4 and the tack layer 6 can be formed from the aforementioned resin layers to be polymerized by heat or light.

Since the UV cured layer 5 is formed by curing a UV curable resin by UV, anisotropic conductive connection of the conductive particles 2 can be performed at lower temperature. This can also be applied to a substrate which requires a decrease in temperature as a connection condition (for example, plastic substrate).

The tack layer 6 is a resin layer having tackiness. Due to the presence of the tack layer 6, shifting of the anisotropic conductive film during anisotropic conductive connection can be suppressed even when the terminal formation surface is wavy. When the anisotropic conductive film is positioned so that the arrangement region of the conductive particles in the anisotropic conductive film corresponds to the forming position of the terminal of the electronic component or the substrate in advance and anisotropic conductive connection is performed, this effect is especially significant. The tack layer 6 can be formed for example by laminating an insulating adhesive over the conductive particles 2 which are held by the adhesive layer 4 and the UV cured layer 5.

The lowest melt viscosity of the insulating adhesive layer 3 is the same as that of the insulating adhesive layer 3 which is a single layer as a resin layer of the anisotropic conductive film, as shown in FIGS. 1B and 3. When the adhesive layer 4, the UV cured layer 5, and the tack layer 6 are provided in the anisotropic conductive film, it is preferable that the lowest melt viscosities of the layers satisfy a relationship of adhesive layer 4<UV cured layer 5≤tack layer 6. From the viewpoint of suppressing flow of the particles, the melt viscosity of the adhesive layer 4 at 80° C. is preferably 3,000 Pa·s or less, and more preferably 1,000 Pa·s or less, and the melt viscosity of the UV cured layer 5 at 80° C. is preferably 1,000 to 20,000 Pa·s, and more preferably 3,000 to 15,000 Pa·s. The melt viscosity of the tack layer 6 at 80° C. is preferably 1,000 to 20,000 Pa·s, and more preferably 3,000 to 15,000 Pa·s. The melt viscosities are values measured using, e.g., a rotational rheometer (TA Instruments) under conditions of a temperature increasing rate of 10° C./min, a constant measurement pressure of 5 g, and a measurement plate diameter of 8 mm.

Figure 5:
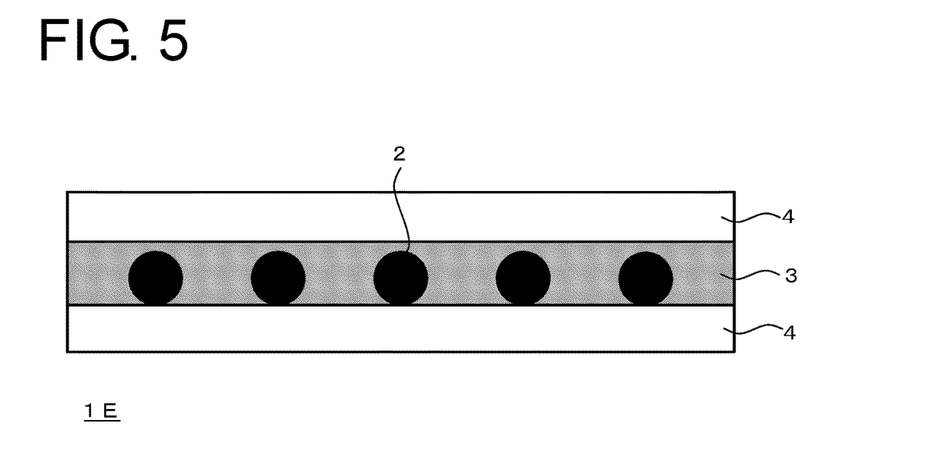
FIG. 5 is a cross-sectional view of an anisotropic conductive film 1E of an example.

Like an anisotropic conductive film 1E shown in FIG. 5, the adhesive layer 4 may be provided on both front and back surfaces of the insulating adhesive layer 3 in which the conductive particles 2 are fixed. Even when the bump thickness of an electronic component to be anisotropically, conductively connected is large, a space between bumps can be filled with a resin. Therefore, good anisotropic conductive connection can be performed.

In the anisotropic conductive film of the present invention, an alignment mark for the electronic component to be anisotropically, conductively connected may be made, if necessary.

Figure 6A:
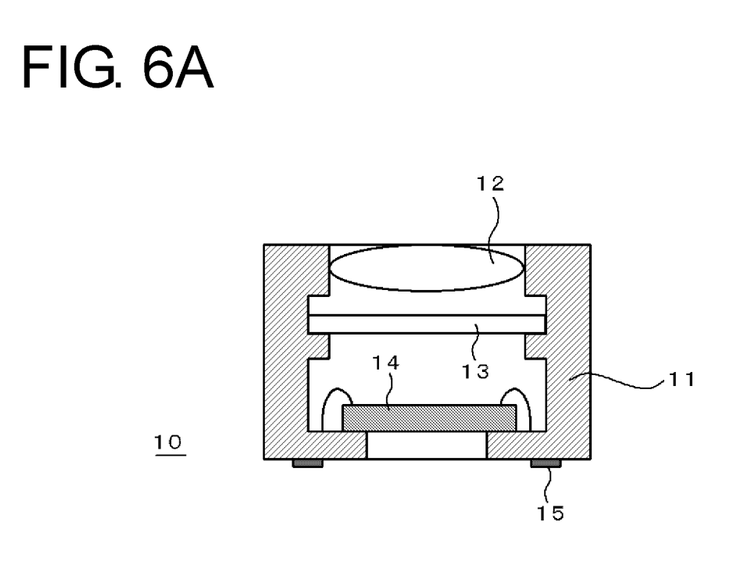
FIG. 6A is a cross-sectional view of a camera module.
Figure 6B:
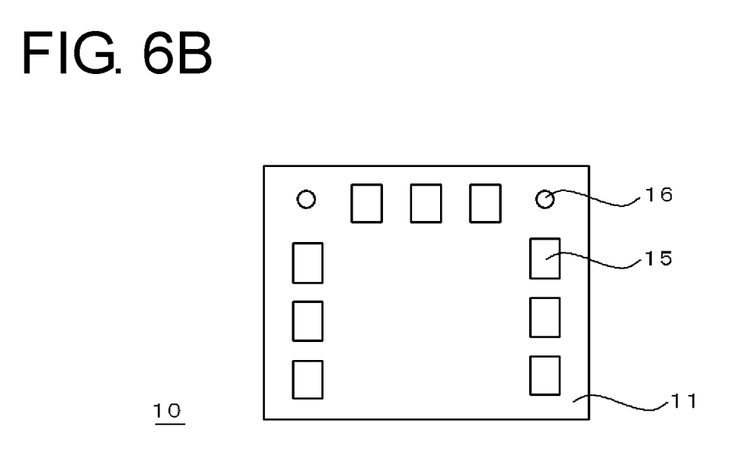
FIG. 6B is a plan view of a terminal forming surface of the camera module.

For example, like a camera module 10 shown in FIGS. 6A and 6B, a lens 12, an optical filter 13, and a chip 14 such as a CMOS are mounted on a ceramic substrate 11, terminals 15 are arranged along three sides of a rectangular terminal formation surface of the ceramic substrate 11, and alignment marks 16 are formed near two corners. When a flexible printed substrate is anisotropically, conductively connected to this terminal formation surface, an arrangement region 2A of conductive particles in which the conductive particles are arranged in a lattice shape can be formed so as to correspond to an arrangement region of the terminals 15, and an alignment mark 7 can be formed at each position corresponding to the alignment marks 16 of the ceramic substrate 11, like an anisotropic conductive film 1F shown in FIG. 7. The alignment mark 7 can be formed by the arrangement of particles for alignment marks.

Figure 7:
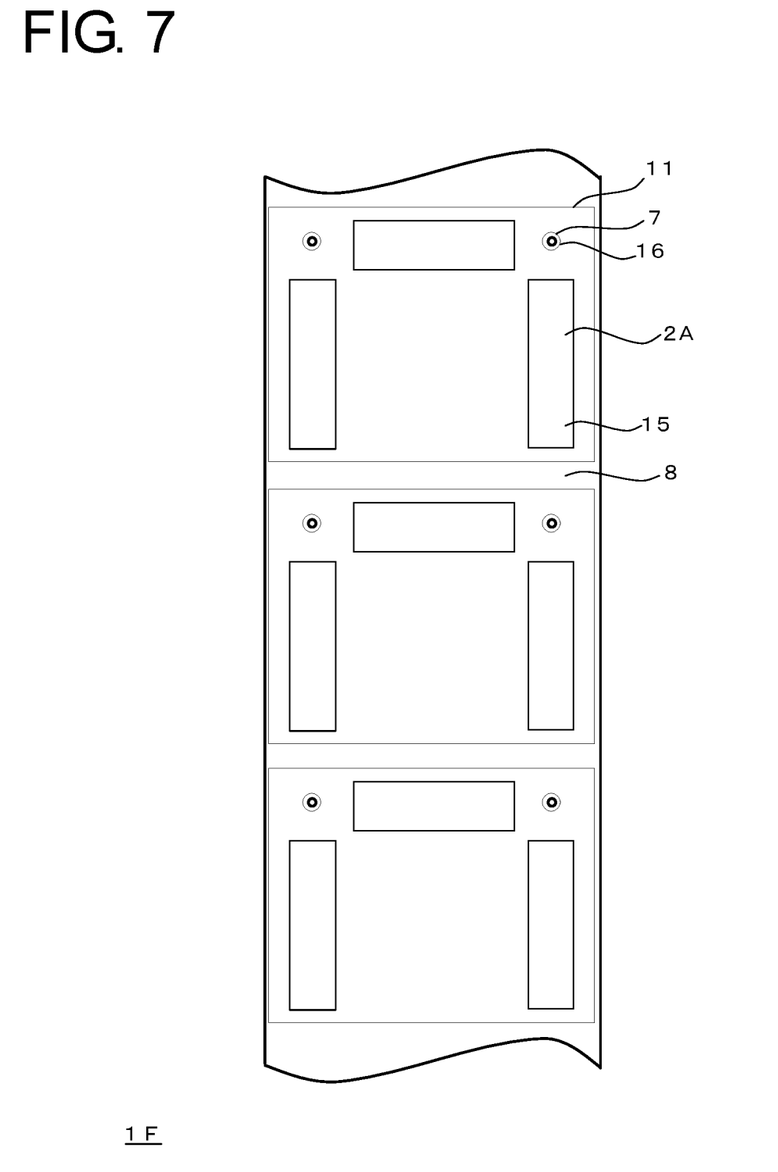
FIG. 7 is a plan view of an anisotropic conductive film 1F of an example.

Herein, as the particles for alignment marks, conductive particles which are the same as the conductive particles 2 for conductive connection can be used. The particle diameter of the particles for alignment marks, however, is smaller than the particle diameter of the conductive particles 2, and for example, may be ⅕ to ⅓ of the conductive particle diameter.

As a method for forming the alignment mark 7 on the anisotropic conductive film using the particles for alignment marks of which the particle diameter is smaller than that of the conductive particles 2 for conductive connection, a mold (microcavity for alignment marks) having a concave portion which is smaller than a mold (microcavity for conductive particles) having a concave portion which is used to regularly arrange the conductive particles during manufacturing of the anisotropic conductive film is produced. Then, the cavity is first filled with the conductive particles for conduction connection, and then filled with the particles for alignment marks. Since the microcavity for alignment marks is smaller than the diameter of the conductive particles for conductive connection, the conductive particles for conductive connection cannot be put into the microcavity for alignment marks. The conductive particles are put into the microcavity for conductive particles and the particles for alignment marks are put into the microcavity for alignment marks. After that, the microcavities are filled with a composition for forming an insulating adhesive layer over the conductive particles and the particles for alignment marks, and the composition is cured. The cured product is taken out from the cavities. Thus, an anisotropic conductive film having the alignment marks 7 can be manufactured.

As shown in FIG. 7, it is preferable that the alignment mark 7 be formed apart from the arrangement region 2A of the conductive particles in the anisotropic conductive film 1F and a draft 8 be formed. This facilitates cutting when the anisotropic conductive film 1F is used in anisotropic conductive connection.

The alignment mark may be formed by locally curing an insulating binder by laser irradiation or the like.

<Anisotropic Conductive Connection>

The anisotropic conductive film 1A can be used in anisotropic conductive connection between a connecting terminal of a first electronic component such as a flexible substrate or a glass substrate and a connecting terminal of a second electronic component such as a camera module, an IC module, or an IC chip. In this case, even when a surface is wavy so that the height of the waviness is about 20 to 50 μm like a ceramic module substrate, a terminal at a convex portion and a terminal at a concave portion of the waviness can be favorably conductively connected to facing terminals, respectively. A terminal suitable for anisotropic conductive connection can have a width of 20 to 1,000 μm and a pitch of 40 to 1,500 μm.

The present invention encompasses a connection structure in which the first and second electronic components are anisotropically, conductively connected using the anisotropic conductive film of the present invention, and in particular, encompasses an aspect in which the first electronic component is a wiring substrate and the second electronic component is a camera module.

EXAMPLES

Hereinafter, the present invention will be described specifically with reference to Examples.

Examples 1 to 10 and Comparative Examples 1 to 6

(1) Manufacturing of Anisotropic Conductive Film

As shown in Tables 1A and 1B, anisotropic conductive films in which conductive particles (SEKISUI CHEMICAL CO., LTD., Micropearl) having a predetermined particle diameter were disposed in an insulating adhesive layer in a lattice shape or randomly were produced. In this case, in order to form the insulating adhesive layer, an anionic epoxy resin composition was prepared from 60 parts by mass of a phenoxy resin (NIPPON STEEL & SUMIKIN CHEMICAL CO., LTD., YP-50), 40 parts by mass of a microencapsulated latent curing agent (ASAHI KASEI E-materials Corporation, NOVACURE HX3941HP), and 20 parts by mass of silica filler (NIPPON AEROSIL CO., LTD., AEROSIL R200), applied to a PET film having a film thickness of 50 μm, and dried in an oven at 80° C. for 5 minutes. Thus, an adhesive layer formed of an insulating resin was formed on the PET film.

On the other hand, a die having a convex portion in a tetragonal lattice pattern at a density shown in Tables 1A and 1B was produced by cutting processing of a nickel plate. Pellets of a publicly known transparent resin were molten and poured into the die, and cooled and cured. Thus, a resin mold having a concave portion in the pattern shown in Tables 1A and 1B was formed. The concave portion of this resin mold were filled with the conductive particles, and coated with the adhesive layer of the aforementioned insulating resin. A curable resin contained in the insulating resin was cured by irradiation with ultraviolet rays. The insulating resin was separated from the mold, to manufacture an anisotropic conductive film of each of Examples and Comparative Example 1. Anisotropic conductive films in Comparative Examples 2 to 6 in which the conductive particles were randomly dispersed were manufactured by stirring the conductive particles and the insulating resin by a planetary centrifugal mixer (Thinky Corporation) to obtain a dispersion of the conductive particles, and forming a coating film of the dispersion.

(2) Evaluation

A flexible printed substrate (copper wiring: line/space (L/S)=100 μm/100 μm, terminal height: 12 μm, polyimide thickness: 25 μm) and a ceramic substrate made of alumina (gold/tungsten wiring: line/space (L/S)=100 μm/100 μm, wiring height: 10 μm, substrate thickness: 0.4 mm) were pressurized under heating (180° C., 1 MPa, 20 seconds) using each anisotropic conductive film manufactured in (1) (film width: 1.2 mm) at a pressurization tool width of 1 mm, to obtain a connection structure.

Figure 8:
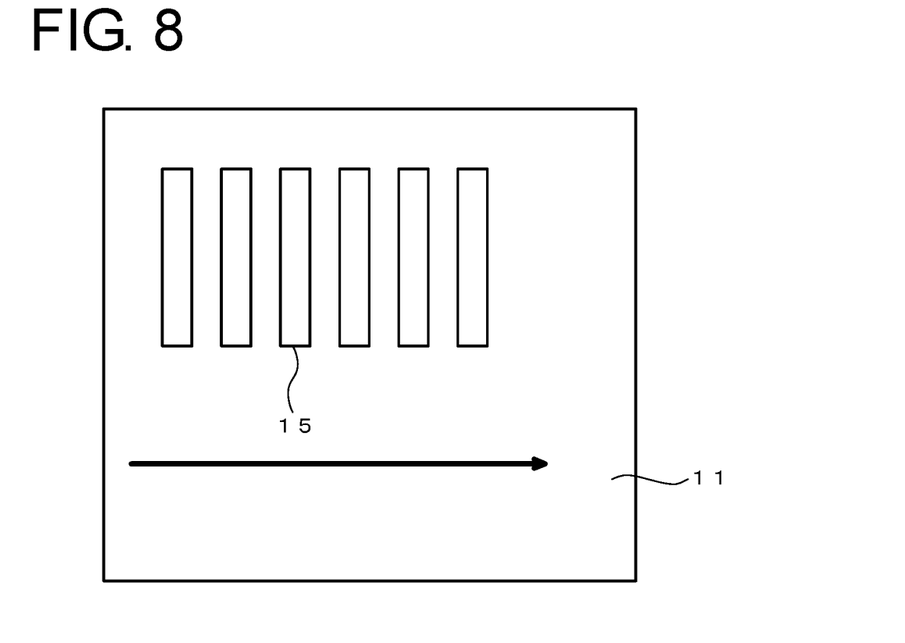
FIG. 8 is a view illustrating a method of measuring the waviness of a ceramic substrate.
Figure 9:
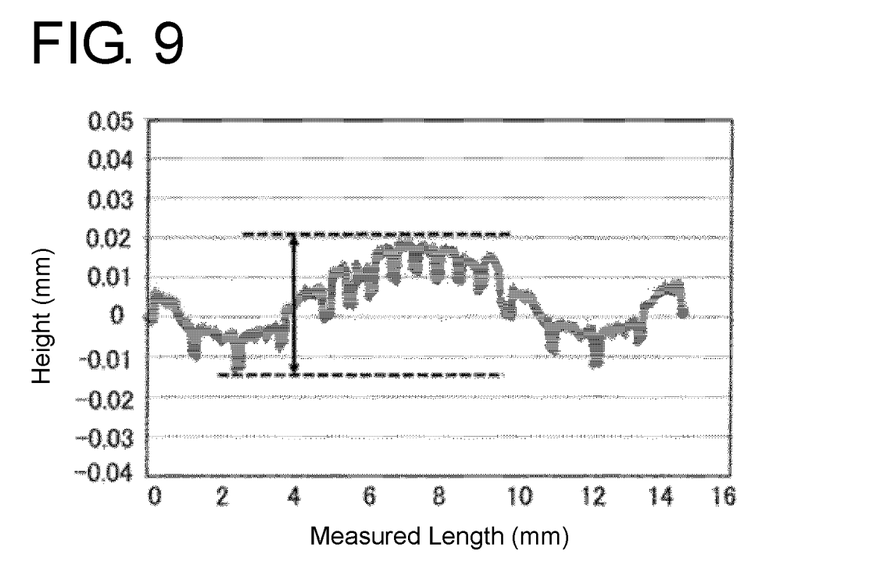
FIG. 9 is a profile of surface irregularities of the ceramic substrate.

The waviness of a terminal formation surface of the ceramic substrate was measured using a surface roughness meter (SURFCORDER SE-400 manufactured by Kosaka Laboratory Ltd.). In this case, the waviness was scanned in the arrangement direction of the terminals 15 in the ceramic substrate 11 by a probe of the surface roughness meter, as shown by an arrow in FIG. 8. Thus, a profile of surface irregularities was obtained. This profile is shown in FIG. 9. The ceramic substrates used in Examples and Comparative Examples were wavy to the same degree.

For each connection structure, (a) capturing efficiency of conductive particles (Ave and Min), (b) conduction resistance, (c) conduction reliability, (d) insulation property evaluation 1 (linking of conductive particles over the whole space between terminals), (e) insulation property evaluation 2 (linking with a size of 50 µm or more of conductive particles in space between terminals), (f) particle position in film thickness direction, (g) attachment, (h) adhesion strength, (i) evaluation of protrusion, and (j) comprehensive evaluation were evaluated as follows. The results are shown in Tables 1A and 1B.

(a) Capturing Efficiency of Conductive Particles (Ave and Min)

The flexible printed substrate was separated from the connection structure, and the flexible printed substrate and the ceramic substrate were observed. For 1,000 terminals at convex portions and 1,000 terminals at concave portions of wavy surface of the ceramic substrate, the capturing efficiency was calculated by the following equation from the number of conductive particles captured by each of the terminals. The average (Ave) and the minimum value (Min) thereof were calculated.

Capturing efficiency=(observed number of captured particles/theoretical number of captured particles)×100

Theoretical number of captured particles=(particle density×terminal area)

A preferable capturing efficiency of the conductive particles is varied depending on the type or application of electronic components to be anisotropically, conductively connected. When the capturing efficiency is small, the conduction reliability is decreased. Therefore, the minimum value (Min) of the capturing efficiency at the concave portions is usually, preferably 20% or more, and more preferably 30% or more.

In general, a camera module is an expensive electronic component, and the resistance to heating and pressurizing thereof is low. Therefore, it is preferable that reattachment due to connection failure during connection between the camera module and the wiring substrate be avoided as much as possible. For these reasons, the minimum value (Min) is preferably more than 80%.

(b) Conduction Resistance

The conduction resistance of the connection structure was measured at a current of 1 mA using a digital multimeter (34401A, Agilent Technologies) by a four probe method. A case where the measured resistance value was 2Ω or less was determined to be OK, and a case where the measured resistance value was more than 2Ω was determined to be NG.

(c) Conduction Reliability

The connection structure was left in a constant temperature bath of a temperature of 85° C. and a humidity of 85% RH for 500 hours, and the conduction resistance was measured similarly to the measurement of (b). A case where the conduction resistance was 2Ω or less and the conduction resistance was not increased was determined to be OK, and other cases were determined to be NG.

(d) Insulation Property Evaluation 1 (Linking of Conductive Particles Over Whole Space Between Terminals)

At 450 spaces between the terminals of the connection structure with the space size being 100 µm, the number of linking of the particles over the whole space between the wirings was counted. For such a connection structure including at least one linking, the insulation properties of the connection structure were evaluated to be NG.

(e) Insulation Property Evaluation 2 (Linking with Size of 50 µm or More of Conductive Particles in Space Between Terminals)

At 450 spaces between the terminals of the connection structure with the space size being 100 µm, the number of linking with a size of 50 µm or more of the conductive particles was counted.

(f) Particle Position in Film Thickness Direction

The particle position in the film thickness direction of the anisotropic conductive film was measured as a distance from the film surface facing the flexible printed substrate (distance on an FPC side) and a distance from the film surface facing the ceramic substrate (distance on a ceramic substrate side). This measurement was performed by observing the cross section of the anisotropic conductive film by a microscope.

In Examples and Comparative Examples, the variation range of position of the conductive particles in the film thickness direction was less than 10% of the conductive particle diameter.

(g) Attachment

The anisotropic conductive film formed on the PET film was temporarily attached to a ceramic substrate (60° C., 1 MPa, 1 second), and the PET film was then separated. At that time, the presence or absence of curling of the anisotropic conductive film was visually observed. No curling was determined to be OK, and curling was determined to be NG.

(h) Adhesion Strength

The adhesion strength between the flexible printed substrate and the ceramic substrate of the connection structure was measured by 90° peeling using a tensile tester. An adhesion strength of 6 N or more was evaluated to be OK, and an adhesion strength of less than 6 N was evaluated to be NG.

(i) Evaluation of Protrusion

A case where the resin was not protruded from a junction between the flexible printed substrate and the ceramic substrate of the connection structure or the protrusion was less than 1 mm was determined to be OK, and a case where the protrusion of the resin was 1 mm or more was determined to be NG.

(j) Comprehensive Evaluation

A case where the evaluations of all (a), (b), (c), (d), (g), (h), (i), and (j) were OK was determined to be OK, and a case where one of the evaluations was NG was determined to be NG.

TABLE 1A

| | Example 1 | | Example 2 | | Example 3 | | Example 4 | | Example 5 | | Example 6 | | Example 7 | | Example 8 | | Example 9 | | Example 10 | |
|---|---|---|---|---|---|---|---|---|---|---|---|---|---|---|---|---|---|---|---|---|
| Particle Diameter | 15 | | 20 | | 10 | | 15 | | 15 | | 15 | | 15 | | 15 | | 15 | | 33 | |
| Particle Density (particle/mm²) | 250 | | 150 | | 850 | | 250 | | 250 | | 250 | | 250 | | 250 | | 250 | | 250 | |
| Particle Arrangement | Tetragonal Lattice | | Tetragonal Lattice | | Tetragonal Lattice | | Tetragonal Lattice | | Tetragonal Lattice | | Tetragonal Lattice | | Tetragonal Lattice | | Tetragonal Lattice | | Tetragonal Lattice | | Tetragonal Lattice | |
| | Concave Portion | Convex Portion | Concave Portion | Convex Portion | Concave Portion | Convex Portion | Concave Portion | Convex Portion | Concave Portion | Convex Portion | Concave Portion | Convex Portion | Concave Portion | Convex Portion | Concave Portion | Convex Portion | Concave Portion | Convex Portion | Concave Portion | Convex Portion |
| Capturing Efficiency Ave | 97.7% | 93.3% | 97.2% | 97.2% | 95.1% | 92.7% | 96.8% | 94.5% | 96.8% | 94.5% | 96.8% | 94.5% | 96.8% | 94.5% | 97.5% | 95.8% | 98.3% | 96.5% | 97.5% | 95.8% |
| Capturing Efficiency Min | 96.0% | 92.0% | 93.3% | 93.3% | 94.1% | 91.8% | 96.0% | 92.0% | 96.0% | 92.0% | 96.0% | 92.0% | 96.0% | 92.0% | 96.0% | 92.0% | 96.0% | 96.0% | 96.0% | 92.0% |
| Conduction Resistance | OK | | OK | | OK | | OK | | OK | | OK | | OK | | OK | | OK | | OK | |
| Conduction Reliability (85° C., 85% RH, 500 hr) | OK | | OK | | OK | | OK | | OK | | OK | | OK | | OK | | OK | | OK | |
| Insulation Property Evaluation 1: Linking Of Conductive Particles Over Whole Space Between Terminals | 0 | | 0 | | 0 | | 0 | | 0 | | 0 | | 0 | | 0 | | 0 | | 0 | |
| Insulation Property Evaluation 2: Linking With Size Of 50 μm Or More Of Conductive Particles In Space Between Terminals | 0 | | 0 | | 0 | | 0 | | 0 | | 0 | | 0 | | 0 | | 0 | | 0 | |
| Particle Position In Film Thickness Direction | 5 | | 25 | | 7.5 | | 7 | | 5 | | 1 | | 9.9 | | 10 | | 0 | | 2.5 | |
| Distance On Ceramic Substrate Side: μm | 5 | | 25 | | 7.5 | | 3 | | 10 | | 9 | | 0.1 | | 0 | | 0 | | 2.5 | |
| Film Thickness μm | 25 | | 25 | | 25 | | 25 | | 30 | | 25 | | 25 | | 25 | | 15 | | 35 | |
| Film Thickness/Conductive Particle Diameter | 1.7 | | 1.3 | | 2.5 | | 1.7 | | 2.0 | | 1.7 | | 1.7 | | 1.7 | | 1.0 | | 1.2 | |
| Attachment | OK | | OK | | OK | | OK | | OK | | OK | | OK | | OK | | OK | | OK | |
| Adhesion Strength | 9.5N | | 7N | | 7N | | 10N | | 8N | | 6N | | 8N | | 6N | | 6N | | 6N | |
| Evaluation Of Protrusion | OK | | OK | | OK | | OK | | OK | | OK | | OK | | OK | | OK | | OK | |
| Comprehensive Evaluation | OK | | OK | | OK | | OK | | OK | | OK | | OK | | OK | | OK | | OK | |

TABLE 1B

|  | Comparative Example 1 | | Comparative Example 2 | | Comparative Example 3 | | Comparative Example 4 | | Comparative Example 5 | | Comparative Example 6 | |
| --- | --- | --- | --- | --- | --- | --- | --- | --- | --- | --- | --- | --- |
| Particle Diameter | 5 | | 10 | | 15 | | 20 | | 15 | | 15 | |
| Particle Density (particle/mm$^2$) | 850 | | 850 | | 250 | | 150 | | 250 | | 250 | |
| Particle Arrangement | Tetragonal Lattice | | Random | | Random | | Random | | Random | | Random | |
| Capturing Efficiency Ave | Concave Portion | Convex Portion | Concave Portion | Convex Portion | Concave Portion | Convex Portion | Concave Portion | Convex Portion | Concave Portion | Convex Portion | Concave Portion | Convex Portion |
|  | 41.5% | 34.6% | 58.2% | 44.5% | 92.0% | 68.0% | 93.3% | 93.3% | 95.0% | 70.0% | 52.0% | 40.3% |
| Capturing Efficiency Min | 25.9% | 20.0% | 43.5% | 32.9% | 76.0% | 52.0% | 80.0% | 80.0% | 80.0% | 56.0% | 36.0% | 20.0% |
| Conduction Resistance | OK | OK | OK | OK | OK | OK | OK | OK | OK | OK | OK | OK |
| Conduction Reliability (85° C., 85% RH, 500 hr) | NG | NG | NG | OK | OK | OK | OK | OK | OK | OK | NG | NG |
| Insulation Property Evaluation 1: Linking Of Conductive Particles Over Whole Space Between Terminals | 0 | | 0 | | 1 | | 2 | | 1 | | 1 | |
| Insulation Property Evaluation 2: Linking With Size Of 50 μm Or More Of Conductive Particles In Space Between Terminals | 0 | | 1 | | 2 | | 5 | | 2 | | 2 | |
| Particle Position In Film Thickness Direction Distance On FPC Side: μm | 10 | | — | | — | | — | | — | | — | |
| Distance On Ceramic Substrate Side: μm | 10 | | — | | — | | — | | — | | — | |
| Film Thickness μm | 25 | | 25 | | 25 | | 22 | | 14 | | 39 | |
| Film Thickness/ Conductive Particle Diameter | 5.0 | | 2.5 | | 1.7 | | 1.1 | | 0.9 | | 2.6 | |
| Attachment | OK | | OK | | OK | | OK | | Curing | | OK | |
| Adhesion Strength | 10N | | 10N | | 9N | | 7N | | 6.5N | | 10N | |
| Evaluation Of Protrusion | OK | | OK | | OK | | OK | | OK | | NG | |
| Comprehensive Evaluation | NG | | NG | | NG | | NG | | NG | | NG | |

As seen from Tables 1A and 1B, in the connection structures using the anisotropic conductive films in Examples 1 to 10 in which the conductive particle diameter was 10 μm or more, the conductive particles were regularly arranged, and the film thickness was 1 or more times and 2.5 or less times the conductive particle diameter, both the average and the minimum value of the capturing efficiency were more than 90%, the capturing efficiency was even in spite of waviness of the ceramic substrate, and the comprehensive evaluation was excellent.

On the other hand, in Comparative Example 1 in which the conductive particle diameter was less than 10 μm, the capturing efficiency was low due to waviness of the ceramic substrate, and the conduction characteristics were low.

As seen from Comparative Examples 2 to 6, even when the conductive particle diameter was 10 μm or more, the capturing efficiency of the conductive particles which were randomly disposed was not stable, and in particular, the capturing efficiency at the convex portions of the ceramic substrate tended to be low.

As seen from Comparative Example 5, when the conductive particles were randomly disposed and the film thickness was less than 1.0 time the conductive particle diameter, tackiness was low due to influence of particle assembly, and attachment was low.

As seen from Comparative Example 6, when the film thickness was more than 2.5 times the conductive particle diameter, the resin tended to be protruded from the connection structure.

In Examples 1 to 6 in which the conductive particles were apart from both the front and back surfaces of the anisotropic conductive film at a distance which was 10% or more of the conductive particle diameter, and also in Examples 7 to 9 in which the conductive particles were near the surface of the insulating adhesive layer or in contact with the insulating adhesive layer, the conductive particles were regularly arranged, and the variation of position of the conductive particles in the film thickness direction was suppressed. Therefore, it can be seen that a part where the density of the conductive particles was excessively low is difficult to be formed in spite of wavy surface of the substrate, and there is no problem relating to attachment.

Example 11 and Comparative Examples 7 to 10

(1) Manufacturing of Anisotropic Conductive Film

Influence of variation of particle density of conductive particles and variation of position of the conductive particles in a film thickness direction on conductive particle capturing properties and occurrence of short circuit depending on change of the effective connection area of a terminal was investigated. For this purpose, an anisotropic conductive film (film thickness: 25 µm) (Example 11) in which conductive particles having a particle diameter of 20 µm (SEKISUI CHEMICAL CO., LTD., Micropearl) were arranged in a tetragonal lattice shape at a particle density as viewed in a plan view (i.e., average particle density) of 250 particles/mm² was produced in accordance with Example 1. Anisotropic conductive films (film thickness: 25 µm) (Comparative Examples 7 to 10) in which conductive particles having a particle diameter of 20 µm were randomly disposed at an average particle density shown in Table 2 were produced in accordance with Comparative Example 2. In this case, an insulating adhesive layer was prepared from 30 parts by mass of a bifunctional acrylate (A-200, Shin Nakamura Chemical Co., Ltd.), 40 parts by mass of a phenoxy resin (YP50, Tohto Kasei Co., Ltd.), 20 parts by mass of a urethane acrylate (U-2PPA, Shin Nakamura Chemical Co., Ltd.), 5 parts by mass of a phosphate-type acrylate (PM-2, NIPPON KAYAKU Co., Ltd.), 3 parts by mass of an aliphatic peroxide (PEROYL L, Nippon Oil & Fats Co., Ltd.), and 2 parts by mass of benzyl peroxide (NYPER BW, Nippon Oil & Fats Co., Ltd.).

(2) Variation of Density of Conductive Particles as Viewed in Plan View

For variation of density of the conductive particles as viewed in a plan view of the anisotropic conductive films produced in (1), ten regions having an area of 1 mm×1 mm were extracted in each of the films in the film longitudinal direction. The particle density of the conductive particles at each region as viewed in a plan view was measured. A difference Δd between the maximum and minimum values of the particle density was determined, and the ratio of the difference Δd to the average particle density was determined. The results are shown in Table 2.

(3) Variation of Position of Conductive Particles in Film Thickness Direction

For evaluation of variation range of position of the conductive particles in the film thickness direction of the anisotropic conductive films produced in (1), the film cross section was observed by an electron microscope. 200 continuous conductive particles in the film cross section were measured as to the distance between one surface of the film and each of the conductive particles, and a difference between the maximum and minimum values of 200 measured values was determined (N=200). The results are shown in Table 2.

TABLE 2

| | Particle Arrangement | Average Particle Density (particles/mm²) | Variation Of Density Of Particles As Viewed In Plan View | | | | Variation Of Position Of Particles In Film Thickness Direction |
|---|---|---|---|---|---|---|---|
| | | | Maximum (particles/mm²) | Minimum (particles/mm²) | Δd (particles/mm²) | Δd/Average Particle Density | (Maximum-Minimum) µm |
| Comparative Example 7 | Random | 150 | 181 | 108 | 73 | 0.487 | 5 |
| Comparative Example 8 | Random | 300 | 351 | 268 | 83 | 0.277 | 5 |
| Comparative Example 9 | Random | 450 | 512 | 401 | 111 | 0.247 | 5 |
| Comparative Example 10 | Random | 600 | 682 | 561 | 121 | 0.202 | 5 |
| Example 11 | Tetragonal Lattice | 250 | 256 | 245 | 11 | 0.044 | Less Than 1 |

(4) Conductive Particle Capturing Properties

Figure 10A:
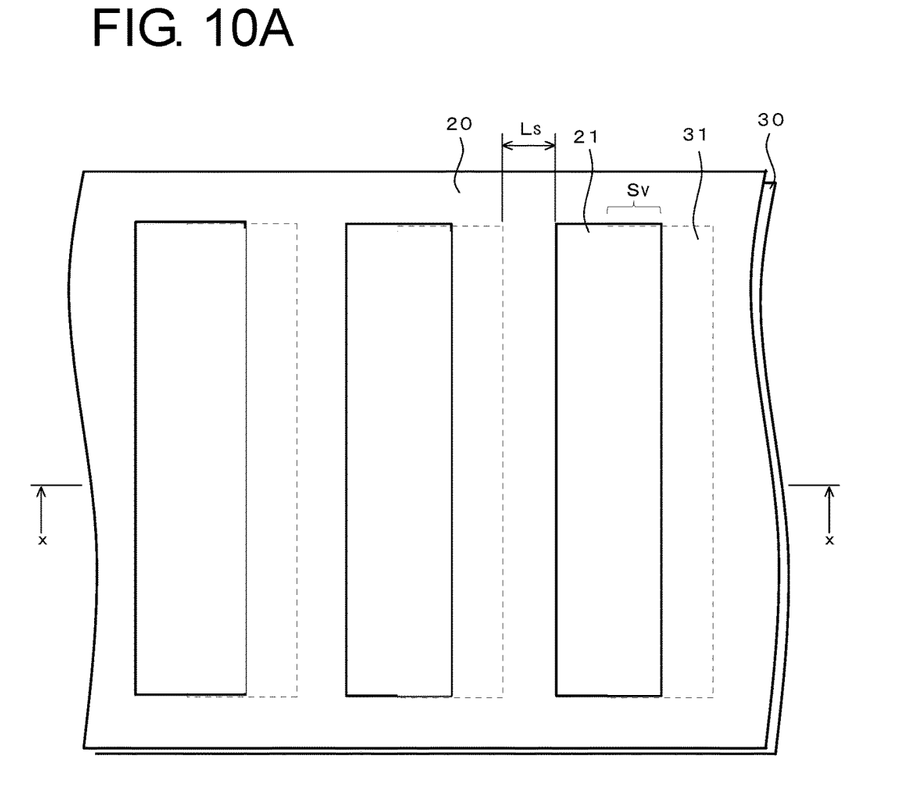
FIG. 10A is a plan view of a connection structure for evaluation.
Figure 10B:
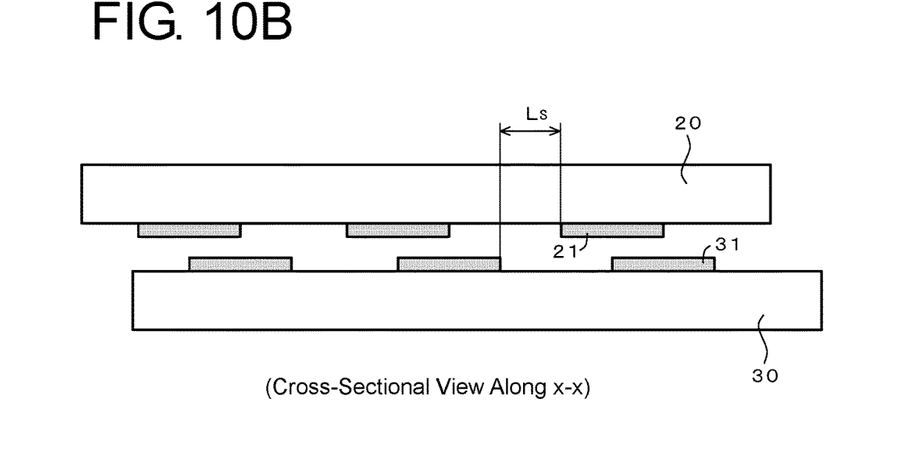
FIG. 10B is a cross-sectional view of the connection structure for evaluation.

A flexible printed substrate (copper wiring: line/space (L/S)=100 µm/100 µm, 150 terminals) and a ceramic substrate (gold/tungsten wiring: line/space (L/S)=100 µm/100 µm, 150 terminals) were pressurized under heating (150° C., 2 MPa, 6 seconds) using each anisotropic conductive film produced in (1) (film width: 1.2 mm) at a tool width of 1 mm, to obtain a connection structure for evaluation. In this case, as shown in FIGS. 10A and 10B, a terminal 21 of a flexible printed substrate 20 and a terminal 31 of a ceramic substrate 30 were shifted by a predetermined distance and faced each other. An effective connection area Sv of each facing terminal (area of a part drawn by dots in FIG. 10A) was approximately varied into five areas described below.

Effective connection area 1: 45,000 µm²

Effective connection area 2: 50,000 µm²

Effective connection area 3: 60,000 µm²

Effective connection area 4: 80,000 µm²

Effective connection area 5: 100,000 µm²

For the connection structures for evaluation having five different effective connection areas, the number of conductive particles captured by the facing terminals was counted. The average of the number of conductive particles captured by all 150 terminals in each connection structure was determined. The average was evaluated in accordance with the following criteria. The results are shown in Table 3.

A: 5 or more (practically preferable)
B: 3 to 4 (causing no practical problem)
C: less than 2 (practically problematic).

TABLE 3

|  | Effective Connection Area | | | | |
| --- | --- | --- | --- | --- | --- |
|  | 1 | 2 | 3 | 4 | 5 |
| Comparative Example 7 | C | C | C | C | C |
| Comparative Example 8 | C | C | B | A | A |
| Comparative Example 9 | C | B | A | A | A |
| Comparative Example 10 | B | A | A | A | A |
| Example 11 | B | A | A | A | A |

As seen from Table 3, in Example 11 in which the conductive particles were regularly arranged, the variation of density conductive particles as viewed in a plan view and the variation of position of conductive particles in the film thickness direction were small as compared with Comparative Examples 7 to 10 in which the conductive particles were randomly disposed, and the conductive particles were captured by terminals having a small effective connection area in spite of the particle density which was lower than those in Comparative Examples 8 to 10.

(5) Short Circuit

The facing terminals were shifted similarly to (4). Connection structures for evaluation having a distance Ls between the terminals (FIG. 10B) which was approximately varied into five different values were obtained.

Distance between terminals a: 35 μm
Distance between terminals b: 50 μm
Distance between terminals c: 60 μm
Distance between terminals d: 70 μm
Distance between terminals e: 80 μm The connection structures for evaluation having five different distances between the terminals were evaluated. A case where short circuit occurred by clogging a space between the terminals with the conductive particles was evaluated to be NG, and a case where short circuit did not occur between the terminals was evaluated to be OK. The results are shown in Table 4.

TABLE 4

|  | Distance Between Terminals | | | | |
| --- | --- | --- | --- | --- | --- |
|  | a | b | c | d | e |
| Comparative Example 7 | NG | OK | OK | OK | OK |
| Comparative Example 8 | NG | NG | NG | NG | OK |
| Comparative Example 9 | NG | NG | NG | NG | NG |
| Comparative Example 10 | NG | NG | NG | NG | NG |
| Example 11 | NG | OK | OK | OK | OK |

As seen from Table 4, in Comparative Example 7 in which the particle density is lower than that in Example 11, short circuit is easy to occur to the same degree as that in Example 11. In Comparative Example 8 in which the particle density is slightly higher than that in Example 11, short circuit is very easy to occur as compared with Example 11. Therefore, when the conductive particles are randomly disposed, the distance between the terminals largely affects occurrence of short circuit. This is considered because among conductive particles randomly dispersed, some conductive particles are linked, the linked conductive particles decrease the distance between the terminals, and as a result, short circuit is easy to significantly occur.

REFERENCE SIGNS LIST 1A, 1B, 1C, 1D, 1E, 1F anisotropic conductive film
$1x$, $1y$ surface of anisotropic conductive film
2, 2a, 2b conductive particle
2A arrangement region of conductive particles
3 insulating adhesive layer
4 adhesive layer
5 UV cured layer (insulating adhesive layer)
6 tack layer
7 alignment mark
8 draft
10 camera module
11 ceramic substrate
12 lens
13 optical filter
14 chip
15 terminal
16 alignment mark
D conductive particle diameter
L1 arrangement pitch
L2 thickness of anisotropic conductive film
L3 distance between one surface of anisotropic conductive film and conductive particle
L4 distance between the other surface of anisotropic conductive film and conductive particle
Ls distance between terminals
Sv effective connection area

The invention claimed is:

1. An anisotropic conductive film comprising:
an insulating adhesive layer; and
conductive particles that are regularly arranged in the insulating adhesive layer in a tetragonal lattice shape, as viewed in a plan view, that is inclined with respect to a longitudinal direction of the film at an angle of 10 to 40 degrees,
wherein
one or both ends of the conductive particles along a thickness direction of the insulating adhesive layer are not exposed,
the conductive particles have a conductive particle diameter, D, of 10 μm or more and 50 μm or less,
a particle density of the conductive particles is in a range of from 150 to 850 particles/mm$^2$,
the insulating adhesive layer has a thickness, L2, of more than 1 times and 2.5 or less times the conductive particle diameter, D,
the thickness, L2, is uniform throughout the insulating adhesive layer,
positions of the conductive particles are varied in the thickness direction of the insulating adhesive layer within a variation range of less than 10% of the conductive particle diameter, D, and $$D + L3 + L4 = L2 \quad (1)$$

where in formula (1),

D and L2 are as defined above,

L3 is a distance between one surface of the insulating adhesive layer and one end of the conductive particles as viewed along the thickness direction of the insulating adhesive layer, L4 is a distance between the other surface of the insulating adhesive layer and the other end of the conductive particles as viewed along the thickness direction of the insulating adhesive layer, and L4 is optionally zero.

2. The anisotropic conductive film according to claim 1, wherein L3 is 10% or more of the conductive particle diameter, D.

3. The anisotropic conductive film according to claim 1, further comprising:

an alignment mark for an electronic component to be anisotropically, conductively connected, the alignment mark being formed by an arrangement of alignment mark particles that are a portion of the conductive particles, and the alignment mark particles having a smaller diameter than the other conductive particles.

4. A connection structure wherein a first electronic component and a second electronic component are anisotropically, conductively connected by the anisotropic conductive film according to claim 1.

5. The connection structure according to claim 4, wherein the first electronic component is a wiring substrate and the second electronic component is a camera module.

6. The connection structure according to claim 4, wherein the insulating adhesive layer in the anisotropic conductive film is formed from a plurality of resin layers.

7. The anisotropic conductive film according to claim 1, wherein the insulating adhesive layer is a single layer.

8. The anisotropic conductive film according to claim 1, wherein the insulating adhesive layer is formed from a plurality of resin layers.

9. The anisotropic conductive film according to claim 1, wherein the conductive particles are metal particles or metal-coated resin particles.

10. The anisotropic conductive film according to claim 1, wherein L2 is more than 1 times and 1.7 or less times the conductive particle diameter, D.

11. The anisotropic conductive film according to claim 1, wherein L4 is less than the conductive particle diameter, D.

12. The anisotropic conductive film according to claim 1, wherein the insulating adhesive layer contains polymerizable resin.

13. A method for manufacturing a connection structure, comprising:

anisotropically conductively connecting a first electronic component with a second electronic component via the anisotropic conductive film according to claim 1.

14. The method according to claim 13, wherein the first electronic component is a wiring substrate and the second electronic component is a camera module.

15. The method according to claim 13, wherein the insulating adhesive layer in the anisotropic conductive film is formed from a plurality of resin layers.

16. The anisotropic conductive film according to claim 1, wherein the conductive particles have a conductive particle diameter, D, of 10 μm or more and 30 μm or less.

17. The anisotropic conductive film according to claim 1, wherein when one end of the conductive particles along the thickness direction of the insulating adhesive layer is not exposed, the other end of the conductive particles is in contact with one of the surfaces of the insulating adhesive layer.

18. The anisotropic conductive film according claim 1, wherein the film has a minimum capturing efficiency of more than 90%, and both ends of the conductive particles along a thickness direction of the insulating adhesive layer are not exposed.

19. The anisotropic conductive film according to claim 18, wherein a difference between maximum and minimum values of particle densities, as viewed in the plan view, measured at ten regions which each have an area of 1 mm×1 mm and are extracted in a longitudinal direction of the anisotropic conductive film is less than 20% of an average of the particle densities at the respective region.

20. The anisotropic conductive film according to claim 1, wherein the anisotropic conductive film has a minimum capturing efficiency of 90% or more.

* * * * *